United States Patent

Levinson et al.

[11] Patent Number: 6,140,023
[45] Date of Patent: Oct. 31, 2000

[54] METHOD FOR TRANSFERRING PATTERNS CREATED BY LITHOGRAPHY

[75] Inventors: Harry J. Levinson, Saratoga; Scott A. Bell, San Jose; Christopher F. Lyons, Fremont; Khanh B. Nguyen, San Mateo; Fei Wang; Chih Yuh Yang, both of San Jose, all of Calif.

[73] Assignee: Advanced Micro Devices, Inc., Sunnyvale, Calif.

[21] Appl. No.: 09/203,447

[22] Filed: Dec. 1, 1998

[51] Int. Cl.[7] ....................................................... G03F 9/00
[52] U.S. Cl. .................. 430/313; 216/41; 216/51
[58] Field of Search .................... 430/313, 317, 430/318, 322, 323, 325, 966, 967; 216/41, 51

[56] References Cited

U.S. PATENT DOCUMENTS

| 4,808,511 | 2/1989 | Holmes | 430/325 |
|---|---|---|---|
| 4,933,743 | 6/1990 | Thomas et al. | 257/742 |
| 5,091,339 | 2/1992 | Carey | 216/18 |
| 5,318,877 | 6/1994 | Ober et al. | 430/270 |
| 5,338,818 | 8/1994 | Brunsvold et al. | 528/43 |
| 5,399,462 | 3/1995 | Sachdev et al. | 430/323 |
| 5,759,748 | 6/1998 | Chun et al. | 430/323 |

*Primary Examiner*—S. Rosasco
*Attorney, Agent, or Firm*—Amin, Eschweiler & Turocy, LLP

[57] ABSTRACT

A lithographic process for fabricating sub-micron features is provided. A silicon containing ultra-thin photoresist is formed on an underlayer surface to be etched. The ultra-thin photoresist layer is patterned with short wavelength radiation to define a pattern. The ultra-thin photoresist is oxidized so as to convert the silicon therein to silicon dioxide. The oxidized ultra-thin photoresist layer is used as a hard mask during an etch step to transfer the pattern to the underlayer. The etch step includes an etch chemistry that is highly selective to the underlayer over the oxidized ultra-thin photoresist layer.

30 Claims, 11 Drawing Sheets

METHOD FOR TRANSFERRING PATTERNS CREATED BY LITHOGRAPHY

TECHNICAL FIELD

The present invention generally relates to photolithography, and more particularly relates to a method of forming sub-micron devices and/or features via short wavelength radiation and ultra-thin photoresists.

BACKGROUND OF THE INVENTION

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes the image area to become either more or less soluble (depending on the coating) in a particular solvent developer. The more soluble areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image the features with radiation of a shorter wavelength. "Long" or "soft" x-rays (a.k.a, extreme ultraviolet (EUV)), wavelength range of lambda=50 to 700 Angstroms (Å) are now at the forefront of research in an effort to achieve the smaller desired feature sizes.

Although EUV lithography provides substantial advantages with respect to achieving high resolution patterning, the shorter wavelength radiation is highly absorbed by the photoresist material. Consequently, the penetration depth of the radiation into the photoresist is limited. The limited penetration depth of the shorter wavelength radiation requires the use of ultra-thin photoresists so that the radiation can penetrate the entire depth of the photoresist in order to effect patterning thereof. However, the thinness of such ultra-thin photoresists results in the etch resistance thereof to be relatively low. In other words, the etch protection afforded by ultra-thin photoresists is limited which in turn limits the EUV lithographic process.

SUMMARY OF THE INVENTION

The present invention relates to a method to facilitate lithographic processes employing extreme ultra-violet (EUV) radiation and/or deep UV radiation in fabricating sub-micron devices and/or features. As noted above, EUV and deep UV radiation are preferred radiation sources in lithographic processes where fine resolution is desired. The short wavelengths of these types of radiation afford for fine patterning (e.g., <0.25 μm). However, these types of radiation are highly absorbed by photoresist material which consequently limits the depth of penetration by the radiation into the photoresist material.

The present invention employs an ultra-thin photoresist material containing silicon. The ultra-thin photoresist is patterned with short wavelength radiation. Thereafter, the patterned photoresist is exposed to an oxygen plasma which transforms the silicon in the photoresist to silicon dioxide thus transforming the photoresist into a hard mask comprising silicon dioxide. The silicon dioxide hard mask of the present invention affords for expanding available etch chemistries useable in EUV and/or deep UV lithographic processes. In particular, these types of lithographic processes require the use of very thin photoresists as a result of the depth of penetration limitations of the short wavelength radiation. Such very thin photoresists are limited in their capacity as etch barriers due to the thickness thereof.

In the present invention, the ultra-thin photoresist is employed in patterning devices and/or features of very fine resolution and after transformation of the photoresist to a silicon dioxide hard mask, the hard mask is employed in a subsequent underlayer etch process. The silicon dioxide hard mask has substantially better etch resistance characteristics than the original silicon containing ultra-thin photoresist. The present invention expands available etch chemistries associated with lithography utilizing ultra-thin photoresists and short wavelength radiation. Thus, the present invention affords for taking advantage of the fine resolution patterning available from EUV and deep UV lithographic processes and mitigates the limitations associated therewith with respect to etch chemistry.

In accordance with one aspect of the present invention, a lithographic process for fabricating sub-micron features is provided. A silicon containing ultra-thin photoresist is formed on an underlayer surface to be etched. The ultra-thin photoresist layer is patterned with short wavelength radiation to define a pattern. The ultra-thin photoresist is oxidized so as to convert the silicon therein to silicon dioxide. The oxidized ultra-thin photoresist layer is used as a hard mask during an etch step to transfer the pattern to the underlayer. The etch step includes an etch chemistry that is highly selective to the underlayer over the oxidized ultra-thin photoresist layer.

Another aspect of the present invention relates to a lithographic process. An intermediate layer is formed on an underlayer surface. An ultra-thin photoresist is formed on the intermediate layer, the ultra-thin photoresist includes silicon. The ultra-thin photoresist layer is patterned with short wavelength radiation to define a pattern. The ultra-thin photoresist is oxidized so as to convert the silicon therein to silicon dioxide. The oxidized ultra-thin photoresist layer is used as a hard mask during an etch step to transfer the pattern to the intermediate layer and the underlayer. The etch step includes an etch chemistry that is selective to the intermediate layer and the underlayer over the oxidized ultra-thin photoresist layer.

Still another aspect of the present invention relates to a lithographic process for fabricating conductive lines. A barrier layer is formed over a substrate. A conductive layer is formed over the barrier layer. An intermediate layer is formed over the conductive layer. An ultra-thin photoresist is formed over the intermediate layer, the ultra-thin photoresist including at least 5% silicon, the ultra-thin photoresist layer having a thickness within the range of 50 Å to 2000 Å. The ultra-thin photoresist layer is patterned with short wavelength radiation to define a pattern of conductive lines, the short wavelength radiation having a wavelength within the range of 4 nm to 200 nm. The ultra-thin photoresist is oxidized with an $O_2$ plasma so as to convert the silicon therein to silicon dioxide. The oxidized ultra-thin photoresist layer is used as a hard mask during an etch step to transfer the pattern to the intermediate layer and the conductive layer. The etch step includes an etch chemistry that is highly selective to the intermediate layer and the conductive layer over the oxidized ultra-thin photoresist layer. The oxidized ultra-thin photoresist layer and the intermediate layer are then removed.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The method of the present invention will be described with reference to the formation of conductive lines via a photolithographic process employing radiation of short wavelength (e.g., EUV radiation and/or deep UV radiation) and an ultra-thin photoresist. Although the present invention is described primarily within the context of fabricating conductive lines, it is to be appreciated that the present invention may be applied in the fabrication of a wide variety of devices and/or features at the sub-micron level. All such applications of the present invention are intended to fall within the scope of the hereto appended claims. The following detailed description is of the best modes presently contemplated by the inventors for practicing the invention. It should be understood that the description of these preferred embodiments are merely illustrative and that they should not be taken in a limiting sense.

Figures 1, 2:
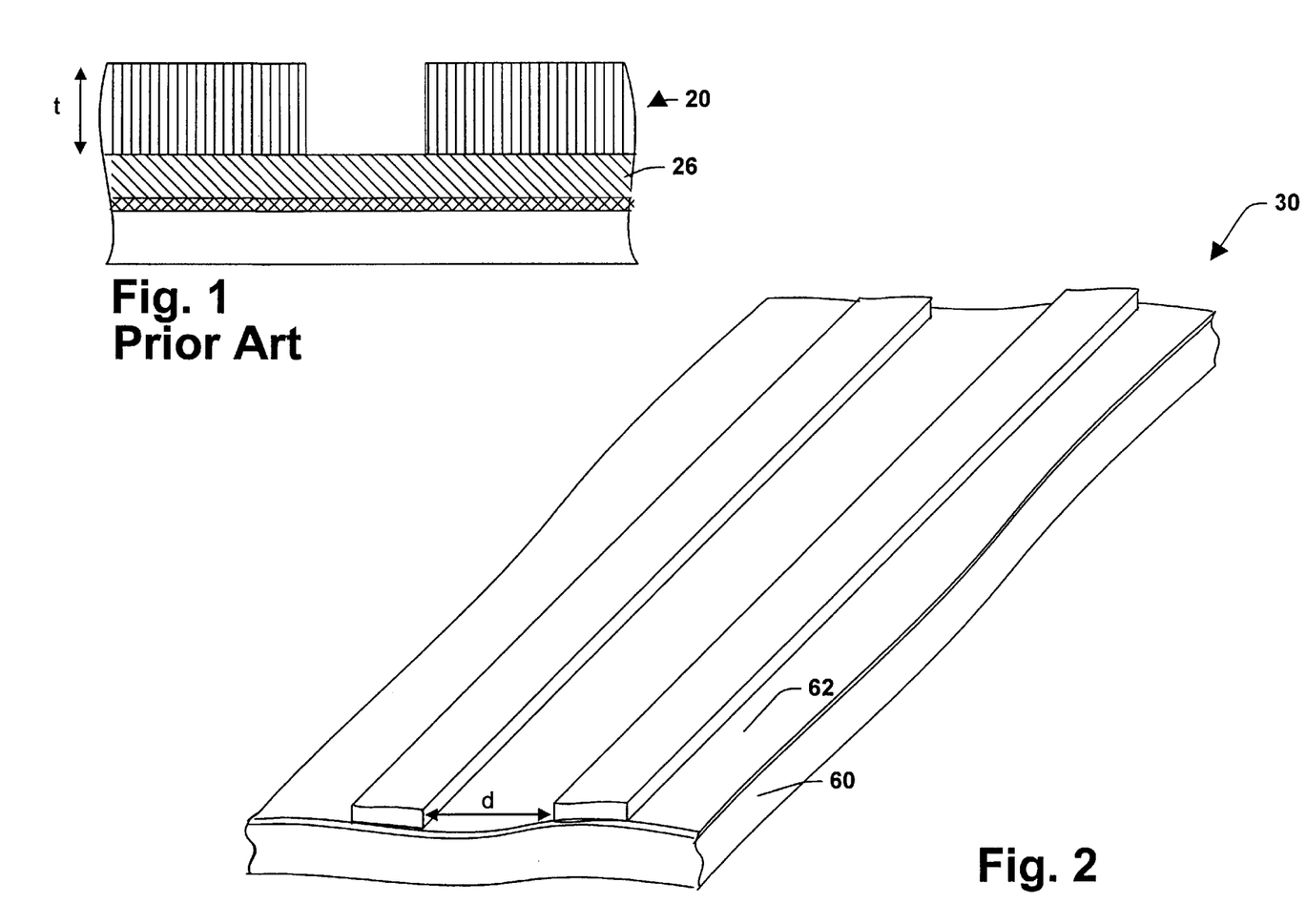
FIG. 1 is a prior art schematic cross-sectional illustration of a conventional patterned resist used in lithographic processes.
FIG. 2 is a perspective illustration of conductive lines formed in accordance with one aspect of the present invention.

FIG. 1 is a cross-sectional illustration of a conventional photoresist layer 20 being used in the formation of conductive lines. As shown, the photoresist layer 20 is substantially thick (e.g., 5,000–10,000 Å). The photoresist layer 20 is patterned so as to define conductive lines which will be etched from the underlying metal layer 26. However, the thickness of the photoresist 20 is not conducive for use with short wavelength radiation because these types of radiation would be highly absorbed by the photoresist layer 20 and not penetrate the entire thickness "t" of the layer 20. As a result, such a conventional scheme for forming a device or feature (e.g., conductive lines) would not be able to take advantage of the improved resolution of patterning offered by the short wavelength radiation.

Turning now to the present invention in detail, FIG. 2 illustrates conductive lines 30 formed in accordance with the present invention. The conductive lines 30 are formed over a substrate 60. A barrier layer 62 is interposed between the conductive lines 30 and the substrate layer 60. The ever increasing demand for miniaturization in the integrated circuits industry has led to an ever constant demand for reduction in separation between conductive lines (e.g., metal lines) in order to reduce integrated circuit size and/or increase density. The conductive lines 30 are formed via photolithographic techniques utilizing short wavelength radiation and ultra-thin photoresists. Accordingly, substantially smaller dimensions of the conductive lines 30 and separation thereof are achieved as compared to conductive lines formed in accordance with the prior art technique discussed with respect to FIG. 1. For example, the conductive lines 30 may be separated by a distance "d" less than about 0.25 μm, and such small dimension is not obtainable using conventional lithographic processes. In another embodiment, the conductive lines 30 may have a separation distance "d" less than about 0.18 μm.

Figure 3:
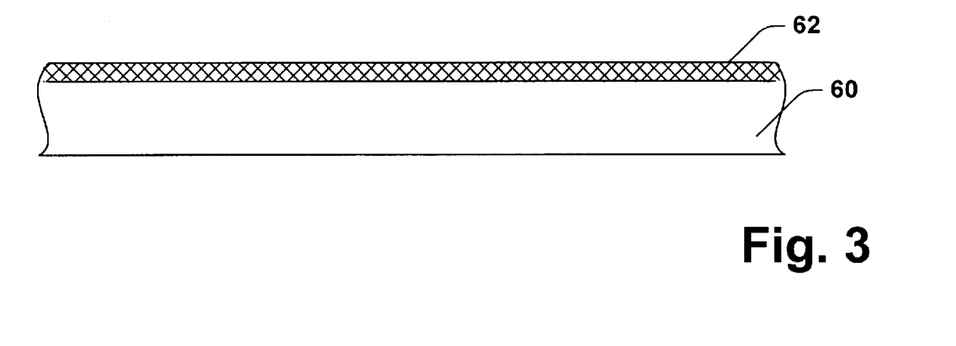
FIG. 3 is a schematic cross-sectional illustration of a silicon substrate having a barrier oxide layer formed thereon in accordance with one aspect of the present invention.
Figure 4:
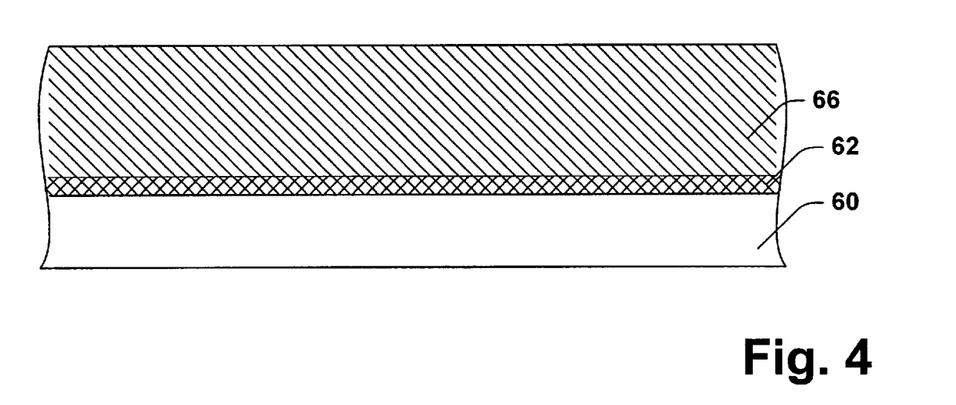
FIG. 4 is a schematic cross-sectional illustration of a conductive layer formed over the barrier oxide layer of FIG. 3 in accordance with one aspect of the present invention.

Turning now to FIGS. 3–15, the fabrication of the conductive lines 30 is discussed in greater detail. It is to be appreciated that the thicknesses of the various layers in the figures are not necessarily drawn to scale so as to facilitate review of the specification and understanding of the present invention. FIG. 3 is a cross-sectional illustration of the substrate 60 and the barrier layer 62 formed thereon. FIG. 4 is a cross-sectional illustration of a layer 66 formed over the barrier layer 62—the conductive lines 30 will be etched from the layer 66. The layer 66 may comprise any suitable conductive material employable for forming conductive patterns in the semiconductor industry. Preferably, the conductive material includes a member selected from the group consisting of refractory materials, such as titanium and titanium alloys, tungsten and tungsten alloys, aluminum and aluminum alloys, copper and copper alloys. The layer 66 may be deposited by any of a variety of suitable deposition techniques, such as CVD processes including low pressure chemical vapor deposition (LPCVD) and plasma enhanced chemical vapor deposition (PECVD), melting or sputtering. Although the present invention is being described within the context of forming conductive lines, it is to be appreciated that the present invention may be applied to forming many different types of patterns in a material. Accordingly, the layer 66 may comprise other types of material (e.g., silicon nitride, titanium, titanium nitride) from which a pattern is to be formed.

Figure 5:
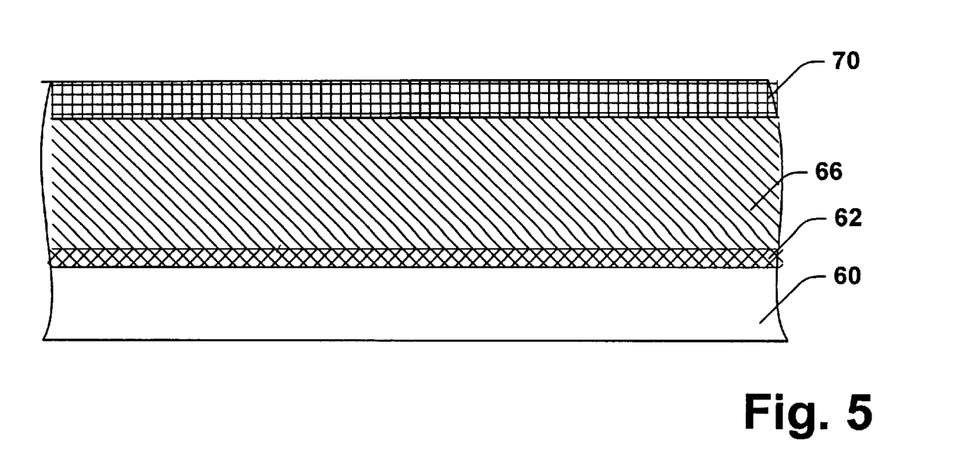
FIG. 5 is a schematic cross-sectional illustration of an organic intermediate layer formed over the conductive layer of FIG. 4 in accordance with one aspect of the present invention.

FIG. 5 illustrates an intermediate layer 70 deposited over the layer 66. Because the layer 66 typically does not have a planar surface (in part due to the uneven surface of the underlying substrate 60), the intermediate layer 70 is deposited with a thickness sufficient to present an essentially planar surface. The composition of the intermediate layer is not critical, and may be any suitable intermediate material such as novolac, polyimide based resins and the like. More particularly, polyimide commercially available from Ciba-Geigy sold under the trade name XU284 and Probimide 285 sold by E. I. DuPont De Nemours Company under the trade name PI2610 may be employed. The intermediate layer 70 may also function as an etch stop layer to protect the underlying layer 66.

The intermediate layer 70 may be deposited by any suitable process (e.g., spin-on coating, Low Pressure Chemical Vapor Deposition (LPCVD), Plasma Enhanced Chemical Vapor Deposition (PECVD), or High Density Plasma Chemical Vapor Deposition (HDPCVD)) to a desired thickness.

Figure 6:
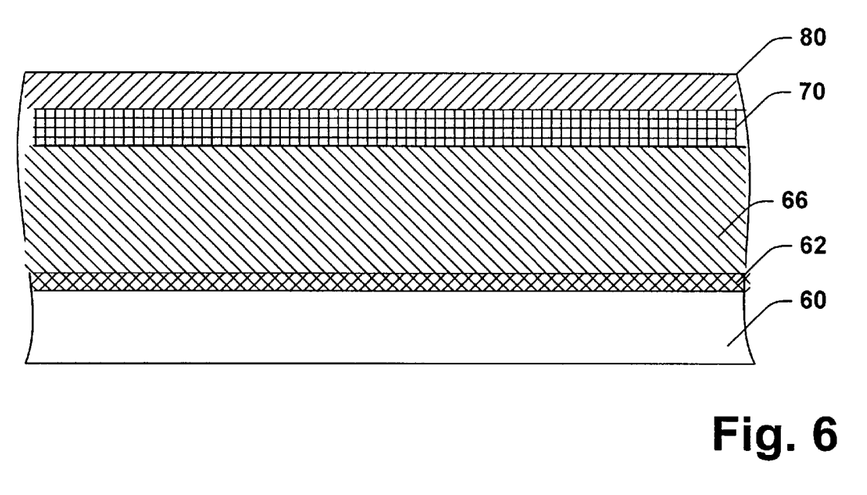
FIG. 6 is a schematic cross-sectional illustration of an ultra-thin photoresist layer formed over the organic intermediate layer of FIG. 5 in accordance with one aspect of the present invention.

FIG. 6 illustrates an ultra-thin photoresist layer 80 formed over the intermediate layer 70. The ultra-thin photoresist layer 80 has a thickness of about 500 Å–5000 Å, however, it is to be appreciated that the thickness thereof may be of any dimension suitable for carrying out the present invention. Accordingly, the thickness of the ultra-thin photoresist 80 can vary in correspondence with the wavelength of radiation used to pattern the ultra-thin photoresist 80. One aspect of the present invention provides for forming the ultra-thin photoresist layer 80 to have a thickness within the range of 1000 Å to 4000 Å. Another aspect of the present invention provides for forming the ultra-thin photoresist layer 80 to have a thickness within the range of 2000 Å to 3000 Å. Yet another aspect of the present invention provides for forming the ultra-thin photoresist layer 80 to have a thickness within the range of 500 Å to 2000 Å. The ultra-thin photoresist 80 may be formed over the intermediate layer 70 via conventional spin-coating or spin casting deposition techniques, for example.

The ultra-thin photoresist layer 80 has a thickness suitable for functioning as a mask for etching the underlying intermediate layer 70 and layer 66 and for forming patterns or openings in the developed ultra-thin photoresist layer 80 that are 0.25 μm or less. Since the ultra-thin photoresist layer 80 is relatively thin compared with I-line, regular deep UV, and other photoresists, improved critical dimension control is realized. It will be appreciated that for certain applications the ultra-thin photoresist layer 80 may be used solely as a mask for etching the underlying intermediate layer 70, and the intermediate layer 70 will serve as a mask for etching the layer 66.

Ultra-thin resists are processed using short wavelength radiation. Short wavelength radiation increases precision and thus the ability to improve critical dimension control. Specific examples of wavelengths to which the ultra-thin photoresist 80 is sensitive (undergo chemical transformation enabling subsequent development) include about 248 nm, about 193 nm, about 157 nm, about 13 nm, about 11 nm, and as low as 4 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, and EUV having a wavelength of about 15 nm to about 10 nm, and as low as 4 nm. It will be appreciated that the radiation being employed may have a wavelength of, for example, less than about 200 nm, less than about 160 nm, less than about 100 nm, less than about 13 nm, or less than about 11 nm.

Positive or negative ultra-thin photoresists may be employed in the methods of the present invention. Photoresists containing silicon are commercially available from a number of sources, including Shipley Company, Hoechst Celanese Corporation, and Brewer. The scope of the present invention as defined by the hereto appended claims is intended to include any ultra-thin photoresist suitable for carrying out the present invention. It is to be appreciated that the ultra-thin photoresist 80 of the present invention includes silicon which will be transformed into silicon dioxide so as to transform the ultra-thin photoresist into a hard mask comprising silicon dioxide.

In one embodiment of the present invention, the ultra-thin photoresist 80 includes at least 5% silicon by weight. In another embodiment of the present invention, the ultra-thin photoresist 80 includes at least 10% silicon by weight. Another embodiment of the present invention has the ultra-thin photoresist 80 including at least 20% silicon by weight. In yet another embodiment of the present invention, the ultra-thin photoresist 80 includes at least 30% silicon by weight. Still yet another embodiment of the present invention has the ultra-thin photoresist 80 including at least 40% silicon by weight.

Figure 7:
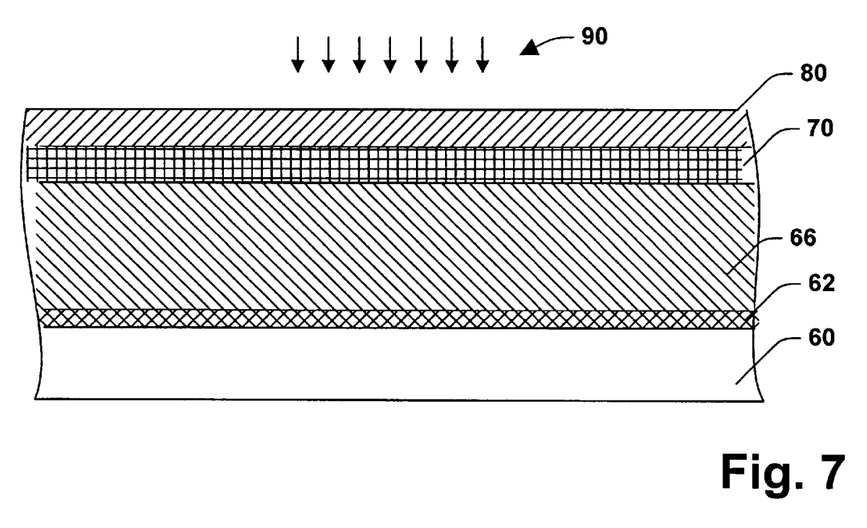
FIG. 7 is a schematic cross-sectional illustration of the ultra-thin photoresist layer of FIG. 6 undergoing a patterning step in accordance with one aspect of the present invention.
Figure 8:
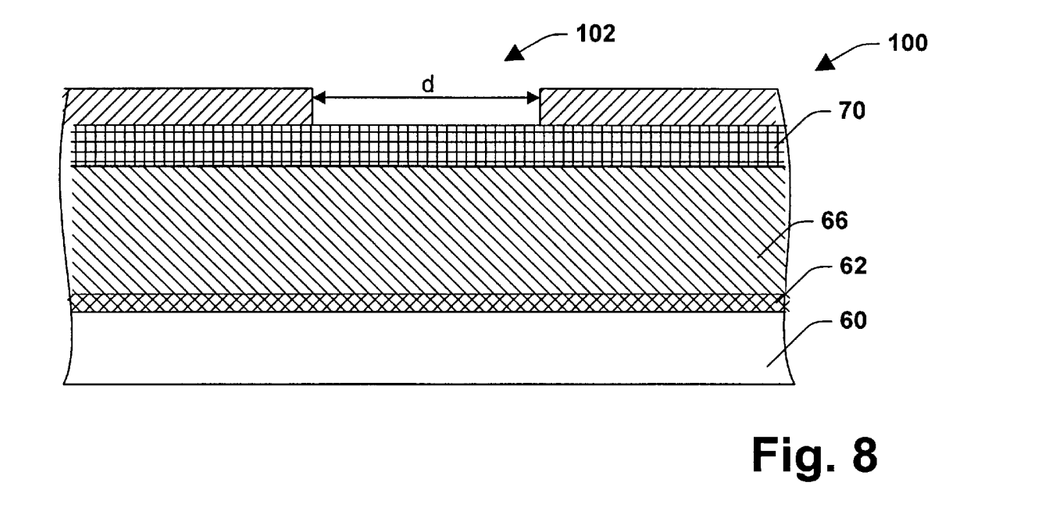
FIG. 8 is a schematic cross-sectional illustration of the ultra-thin photoresist layer of FIG. 7 after the patterning step is substantially complete in accordance with one aspect of the present invention.

Referring to FIG. 7, the ultra-thin photoresist layer 80 then undergoes an exposure/development step 90 to provide a patterned photoresist 100 (FIG. 8). The patterned photoresist 100 is formed using electromagnetic radiation having a relatively small wavelength (for example, less than 200 nm). In this embodiment, electromagnetic radiation having a wavelength of about 13 nm is employed. Since relatively small wavelengths are used, reflectivity concerns are minimized because larger wavelengths are more frequently associated with reflectivity problems. The ultra-thin photoresist layer 80 is selectively exposed to radiation; that is, selected portions of the ultra-thin photoresist layer 80 are exposed to radiation. Either the exposed or unexposed portions of the ultra-thin photoresist layer 80 are removed or developed to provide the patterned photoresist 100.

The critical feature dimension "d" of the exposed portion of the intermediate layer 70 (opening 102 in the patterned photoresist 100 as shown in FIG. 8) is about 0.25 $\mu$m or less, including about 0.18 $\mu$m or less, about 0.09 $\mu$m or less, about 0.075 $\mu$m or less and about 0.05 $\mu$m or less, depending on the wavelength of the radiation used.

The selectively exposed ultra-thin photoresist layer 80 is developed by contact with a suitable developer that removes either the exposed or unexposed portions of the ultra-thin photoresist layer 80. The identity of the developer depends upon the specific chemical constitution of the ultra-thin photoresist layer 80. For example, an aqueous alkaline solution may be employed to remove unexposed portions of the ultra-thin photoresist layer 80. Alternatively, one or more of dilute aqueous acid solutions, hydroxide solutions, water, and organic solvent solutions may be employed to remove selected portions of the ultra-thin photoresist layer 80.

The patterned photoresist 100 may assume any suitable pattern, but typically the patterned photoresist 100 corresponds to the desired pattern (e.g., conductive line pattern). In the present example, the patterned photoresist 100 defines one or more conductive lines 30 (FIG. 2). The patterned photoresist 100 defines one or more openings over the intermediate layer 70 corresponding to trenches separating the conductive lines 30 to be formed. The patterned photoresist 100 serves as an etch mask layer for processing or etching the underlying intermediate layer 70.

Figure 9:
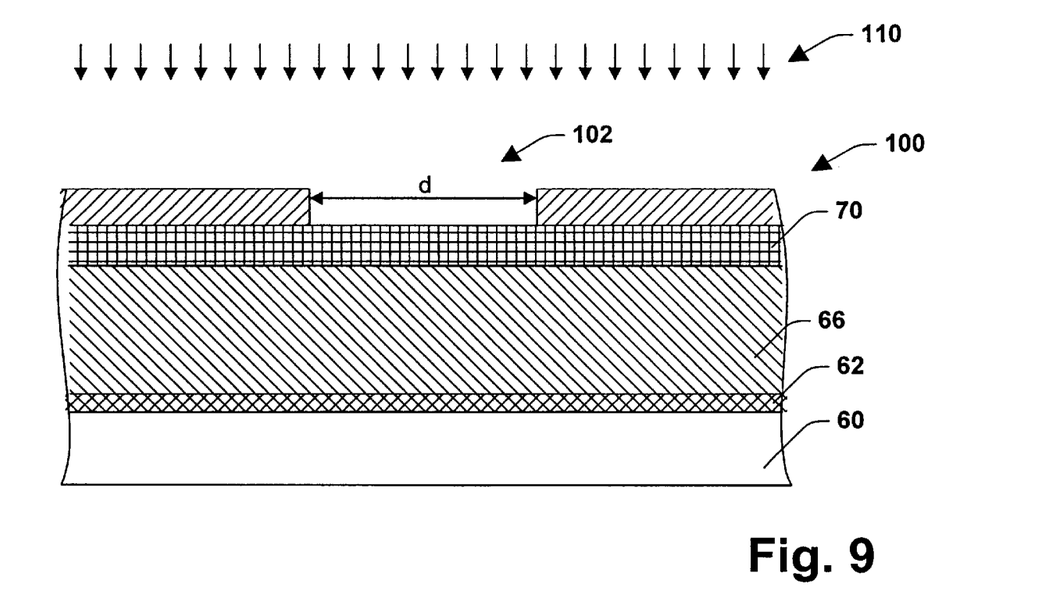
FIG. 9 is a schematic cross-sectional illustration of the ultra-thin photoresist layer of FIG. 8 undergoing an oxidizing step in accordance with one aspect of the present invention.

Referring now to FIG. 9, the patterned photoresist 100 is shown undergoing an oxidizing process 110 wherein the silicon in the photoresist 100 is transformed into silicon dioxide. The oxidation process 110 preferably includes exposing the patterned photoresist to an oxygen ($O_2$) plasma which will oxidize the patterned photoresist so as to form a hard mask containing silicon dioxide ($SiO_2$). Alternatively, provided the photoresist 100 is substantially thin, a thermal oxidation technique may be employed. For example, according to one specific aspect of the invention an entire wafer including the aforementioned layers formed thereon may be placed in a quartz tube in a vertical or horizontal type heat treatment furnace. An oxidizing source such as oxygen and water vapor is fed into the quartz tube, and the wafer is heated up (i.e., annealed) to approximately 900° C. to oxidize the patterned ultra-thin photoresist 100. Depending on the thermal budget for a particular device, the anneal may be either a furnace anneal, a rapid thermal anneal (RTA) or any other suitable anneal. As a result of the anneal, the silicon containing ultra-thin photoresist 100 is transformed into a hard mask containing silicon dioxide.

It is to be appreciated that any suitable oxidation techniques for oxidizing the silicon in the ultra-thin photoresist 100 in accordance with the present invention may be employed and is intended to fall within the scope of the present invention.

Figure 10:
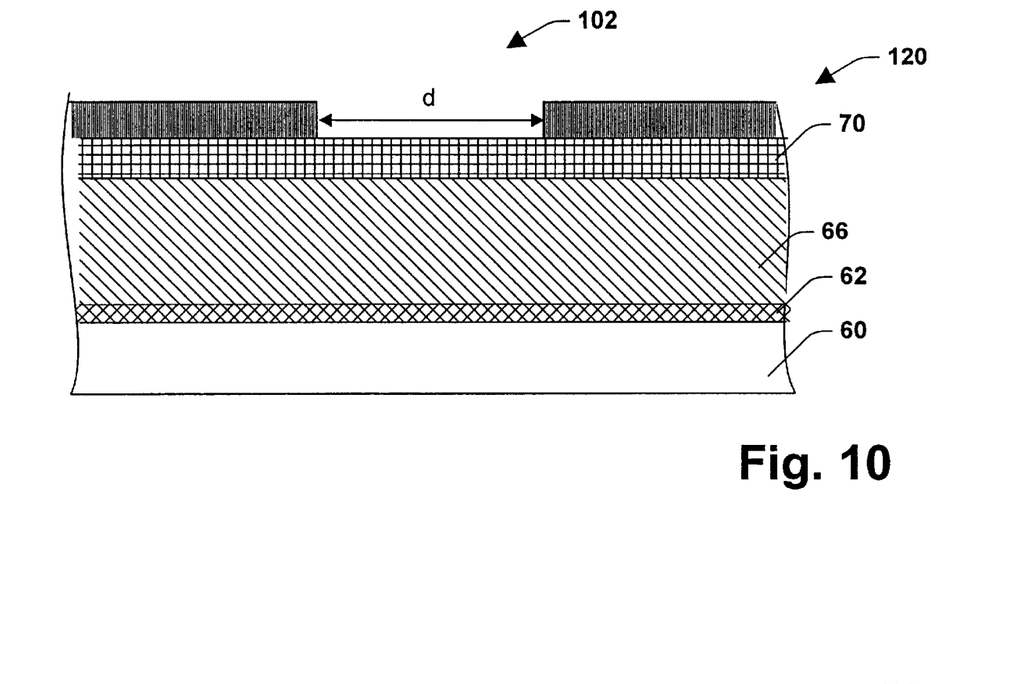
FIG. 10 is a schematic cross-sectional illustration of the ultra-thin photoresist layer of FIG. 9 after the oxidizing step is substantially complete to form a hard mask in accordance with one aspect of the present invention.

FIG. 10 illustrates an oxidized ultra-thin photoresist layer 120 after completion of the oxidizing step 110. The silicon in the ultra-thin photoresist layer 100 has been transformed to silicon dioxide via the oxidation process 110. As a result, the patterned ultra-thin photoresist layer 100 has become hardened in that the oxidized ultra-thin layer 120 comprises silicon dioxide, which imparts substantially greater etch resistance characteristics to the oxidized ultra-thin layer 120 as compared to the unoxidized photoresist layer 100. The oxidized ultra-thin layer 120 will serve as a hard mask during a subsequent intermediate layer/layer 66 etch.

Figure 11:
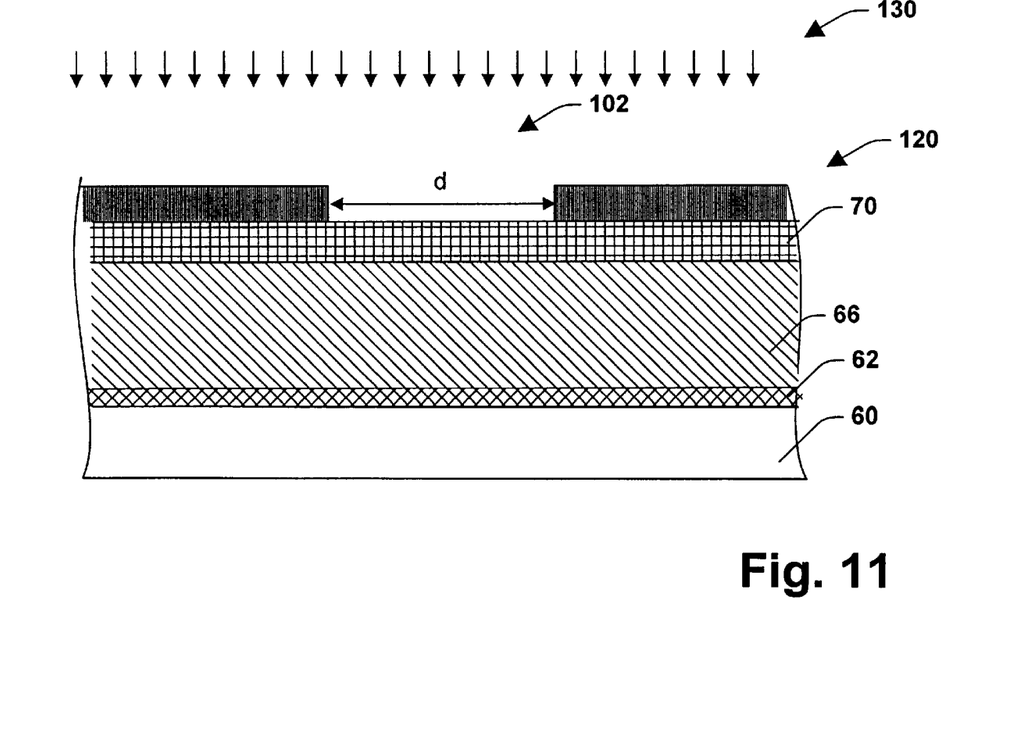
FIG. 11 is a schematic cross-sectional illustration of the intermediate layer, and conductive layer of FIG. 10 undergoing an etching step in accordance with one aspect of the present invention.

Referring now to FIG. 11, the oxidized photoresist layer 120 is used as a mask for selectively etching the intermediate layer 70 and the layer 66 to pattern the layer 66 from an etch step 130. Any suitable etch technique may be used to etch the intermediate layer 70 and the layer 66. Preferably, the intermediate layer 70 and the layer 66 are etched using an anisotropic etching process—dry or wet etching techniques may be employed, although dry etching is preferred. An intermediate layer/layer 66: photoresist etch technique may be used to etch the intermediate layer 70 and the layer 66 to provide the patterned conductive lines 30. Preferably, a selective etch technique may be used to etch the material of the intermediate layer 70 and the layer 66 at a relatively greater rate as compared to the rate that the material of the oxidized photoresist 120 is etched. For example, the etching process 130 may include a reactive ion etch (RIE), that is highly selective of the intermediate layer 70 and layer 66 with respect to $SiO_2$. Alternatively, for example, the etching process 130 may include a chemical downstream etching (CDE) that is selective to organics and metals over silicon oxides ($SiO_x$) and uses at least one of a $CH_3F/CF_4/O_2$ recipe and a $CH_2F_2/CF_4/O_2$ recipe. It is to be appreciated that any suitable etch methodology for selectively etching the organic intermediate layer 70 and the layer 66 over the oxidized photoresist 110 may be employed and is intended to fall within the scope of the hereto appended claims.

In one specific embodiment where the layer 66 comprises tungsten (W) or tungsten nitride (WN), the organic intermediate layer and the layer 66 are selectively etched with a high selectivity fluorocarbon plasma etch (e.g., containing $SF_6$), which is highly selective of the organic intermediate layer and the layer 66 over the oxidized photoresist 120.

The intermediate layer and the W or WN may be etched with the $SF_6$ chemistry using magnetic enhanced reactive ion etching (MERIE), electron cyclotron etching (ECR), or conventional reactive ion etching (RIE) methods. According to the present example, a MERIE method is used with reactant gases of $SF_6$ (30–50 sccm) and $O_2$ (10–40 sccm) at a power level within the range of about 200–800 W, and pressure within the range of about 20–200 mT. This chemistry has very high selectivity to the intermediate layer and the layer 66 and the selectivity of various embodiments, respectively, may be tailored to be greater than 5:1; greater than 10:1; greater than 20:1; greater than 30:1; and greater than 40:1 depending on the particular embodiment employed.

In the case of the layer 66 comprising Al, Ta, TaN, Ti or TiN, the intermediate layer and the layer 66 may be etched with $Cl_2$ chemistry using magnetic enhanced reactive ion etching (MERIE), electron cyclotron etching (ECR), or conventional reactive ion etching (RIE) methods. According to the present example, a MERIE method is used with reactant gases of $Cl_2$ (30–100 sccm) and $BCL_3$ (10–100 sccm) at a power level within the range of about 300–800 W, and pressure within the range of about 60–400 mT. This chemistry has reasonably high selectivity to the intermediate layer and the layer 66 and the selectivity of various embodiments, respectively, may be tailored to be greater than 5:1; greater than 6:1; greater than 7:1; greater than 8:1; greater than 9: 1; and greater than 10:1; depending on the particular embodiment employed.

Figure 12:
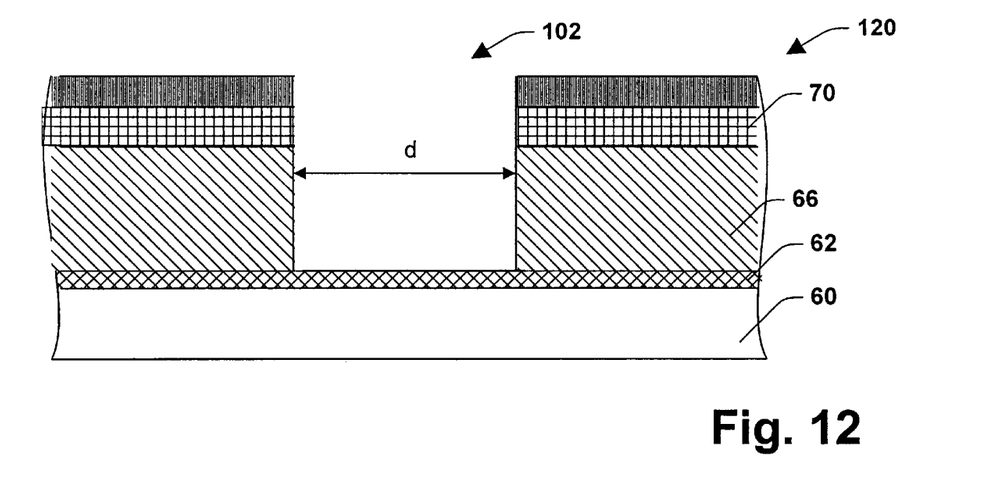
FIG. 12 is a schematic cross-sectional illustration of the intermediate layer and conductive layer of FIG. 11 after the etching step is substantially complete in accordance with one aspect of the present invention.
Figure 13:
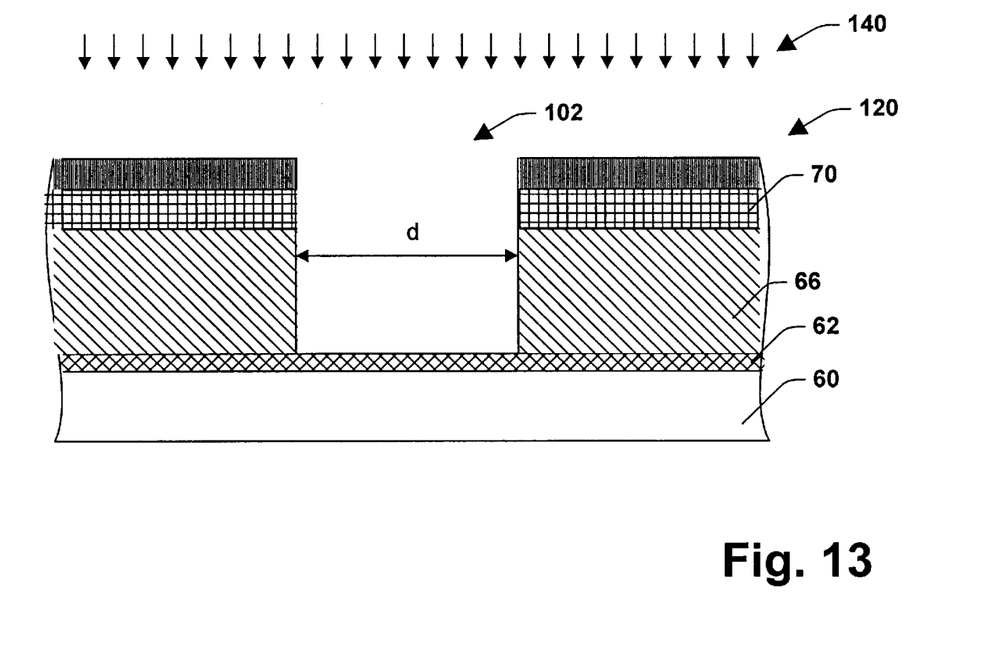
FIG. 13 is a schematic cross-sectional illustration of the hard mask and organic intermediate layer undergoing a removal step in accordance with one aspect of the present invention.
Figure 14:
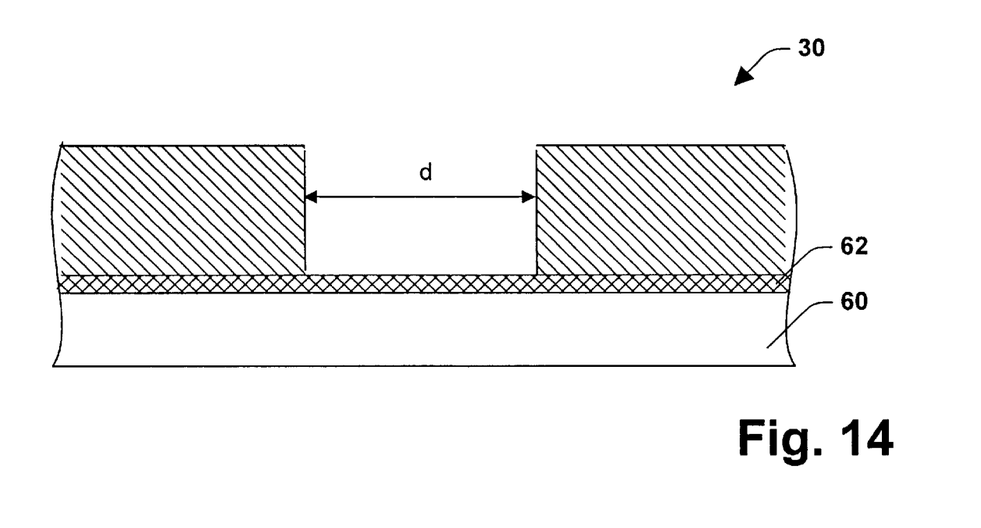
FIG. 14 is a schematic cross-sectional illustration of the conductive lines substantially complete in accordance with one aspect of the present invention.
Figure 15:
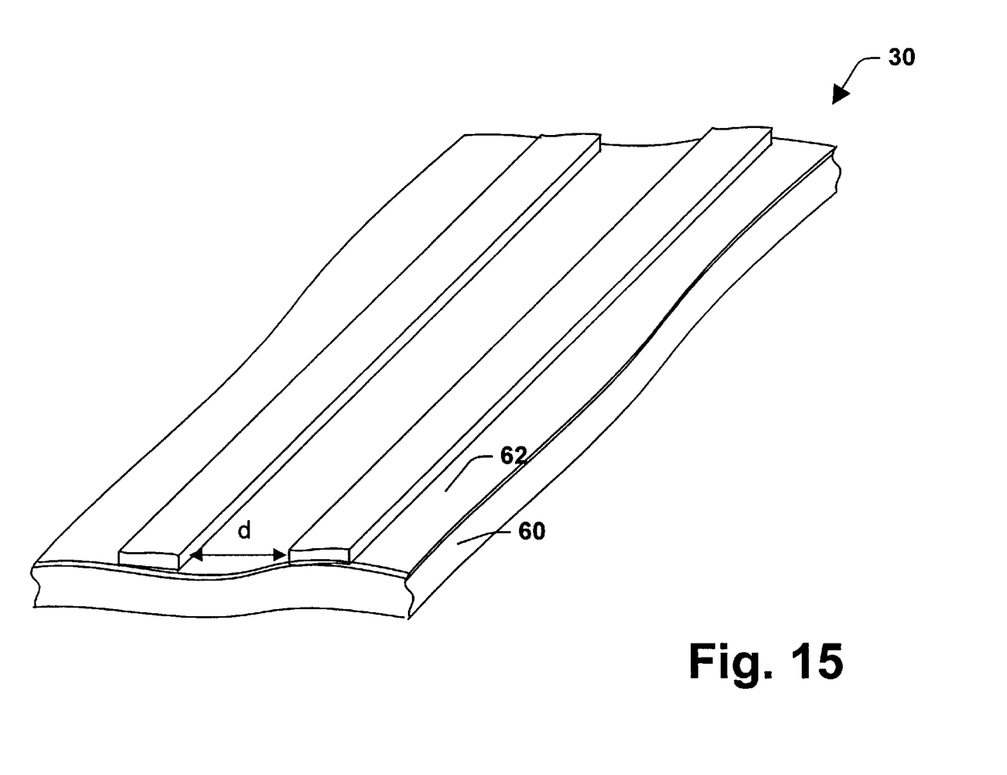
FIG. 15 is a perspective illustration of the conductive lines of FIG. 14 in accordance with one aspect of the present invention.

FIG. 12 illustrates the intermediate layer 66 and the layer 66 substantially etched in accordance with the present invention. Thereafter, as shown in FIG. 13, a stripping process 140 is performed to remove the hard mask layer 120 and the intermediate layer 70. FIGS. 14 and 15 illustrate the conductive lines 30 formed in substantial part. Thereafter, standard processes are performed to electrically insulate the conductive lines 30 from one another.

FIGS. 16–23 illustrate another embodiment of the present invention wherein employment of the intermediate layer 70 is omitted because the surface of the underlayer to be etched is substantially planar and/or an etch stop layer is not required. The deposition and etching processes are substantially the same as mentioned above and therefore detailed discussion related thereto is omitted for sake of brevity.

Figure 16:
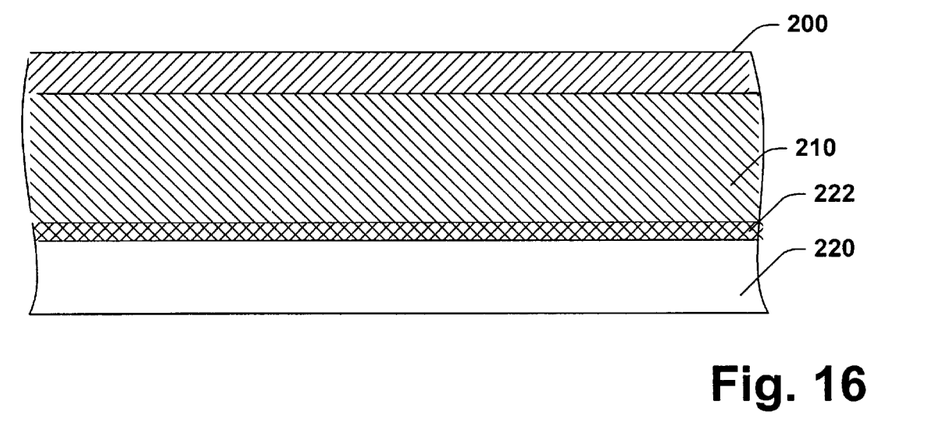
FIG. 16 illustrates an ultra-thin photoresist layer formed over an underlayer in accordance with one aspect of the present invention.

FIG. 16 illustrates an ultra-thin photoresist layer 200 formed over an underlayer 210. The underlayer 210 is formed over a substrate 220, and an optional barrier layer 222 is interposed between the underlayer 210 and the substrate 220.

Figure 17:
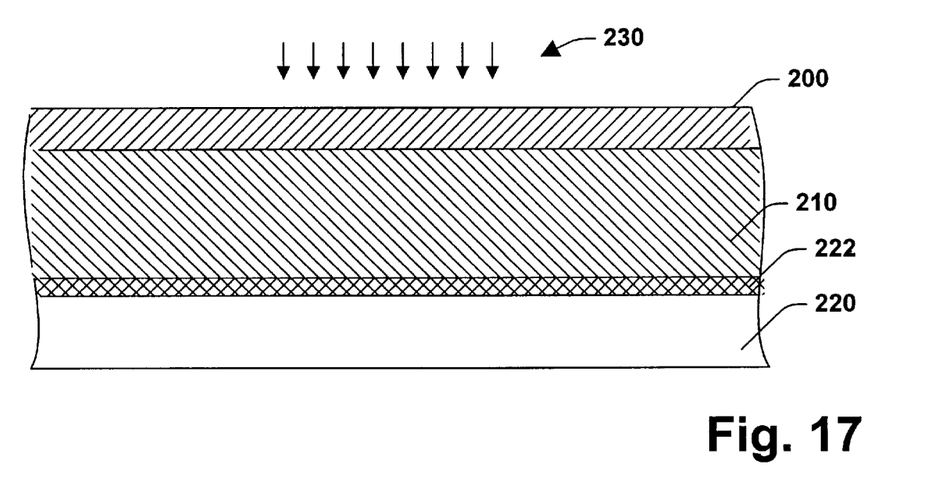
FIG. 17 illustrates the ultra-thin photoresist layer undergoing a patterning process in accordance with one aspect of the present invention.

FIG. 17 illustrates the ultra-thin photoresist layer 200 undergoing a patterning process 230.

Figure 18:
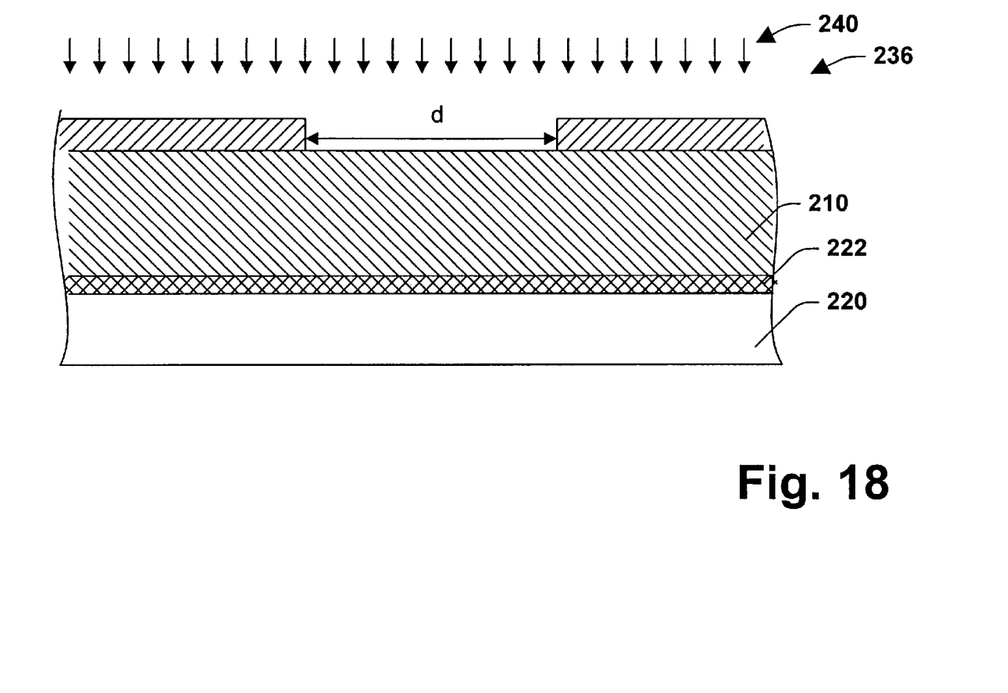
FIG. 18 illustrates the ultra-thin photoresist layer undergoing an oxidizing step in accordance with one aspect of the present invention.

FIG. 18 illustrates a patterned ultra-thin photoresist layer 236 undergoing an oxidizing step 240.

Figure 19:
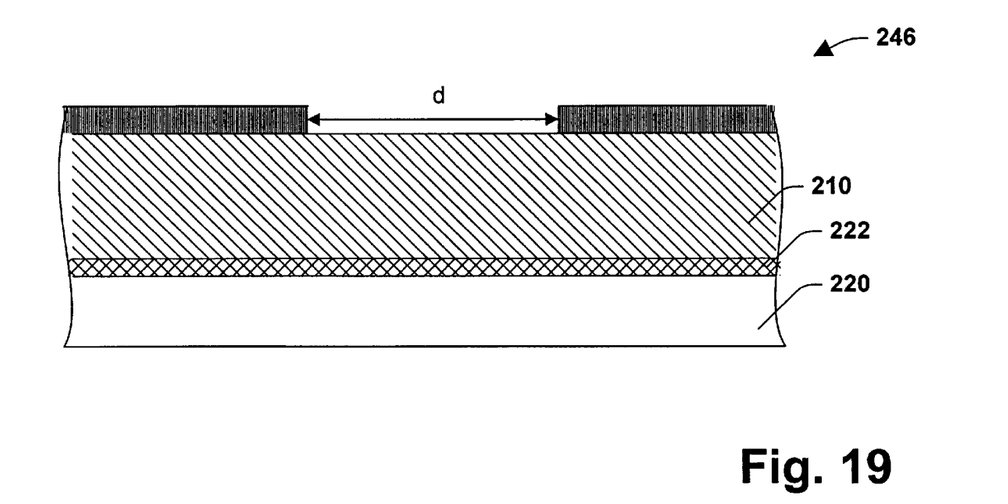
FIG. 19 illustrates an oxidized ultra-thin photoresist layer which will serve as a hard mask during etching of the underlayer in accordance with one aspect of the present invention.

FIG. 19 illustrates an oxidized ultra-thin photoresist layer 246 which will serve as a hard mask during etching of the underlayer 210.

Figure 20:
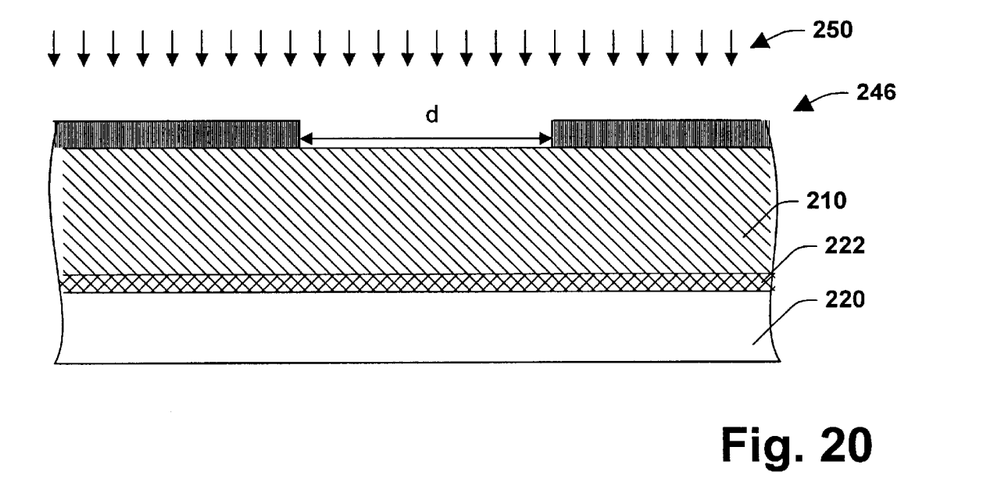
FIG. 20 illustrates the underlayer undergoing an etching step wherein the hard mask is used to shield masked portions of the underlayer from being etched in accordance with one aspect of the present invention.

FIG. 20 illustrates the underlayer 210 undergoing an etching step 250 wherein the hard mask 246 is used to shield masked portions of the underlayer 210 from being etched. The etching step 250 is highly selective of the underlayer 210 over the hard mask.

Figure 21:
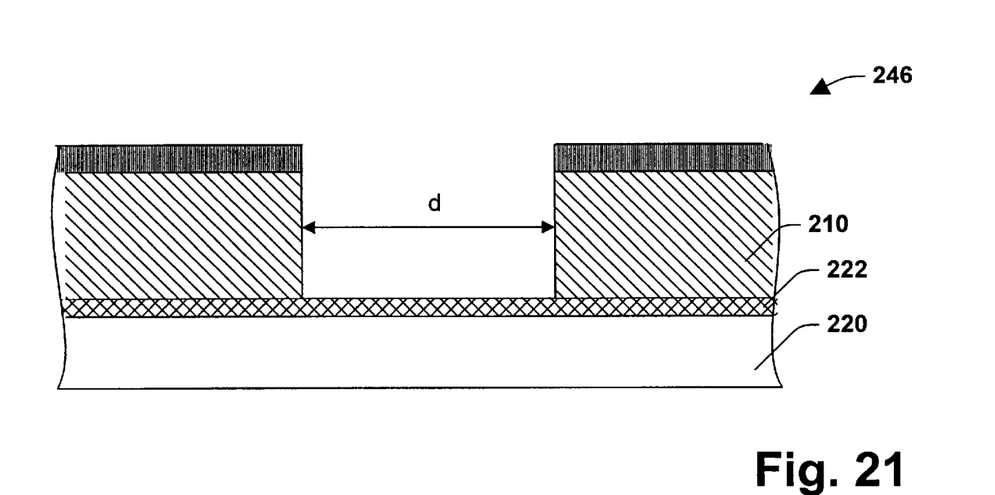
FIG. 21 illustrates the etched underlayer in accordance with one aspect of the present invention.

FIG. 21 illustrates the underlayer 210 after the etching step 250 is substantially complete.

Figure 22:
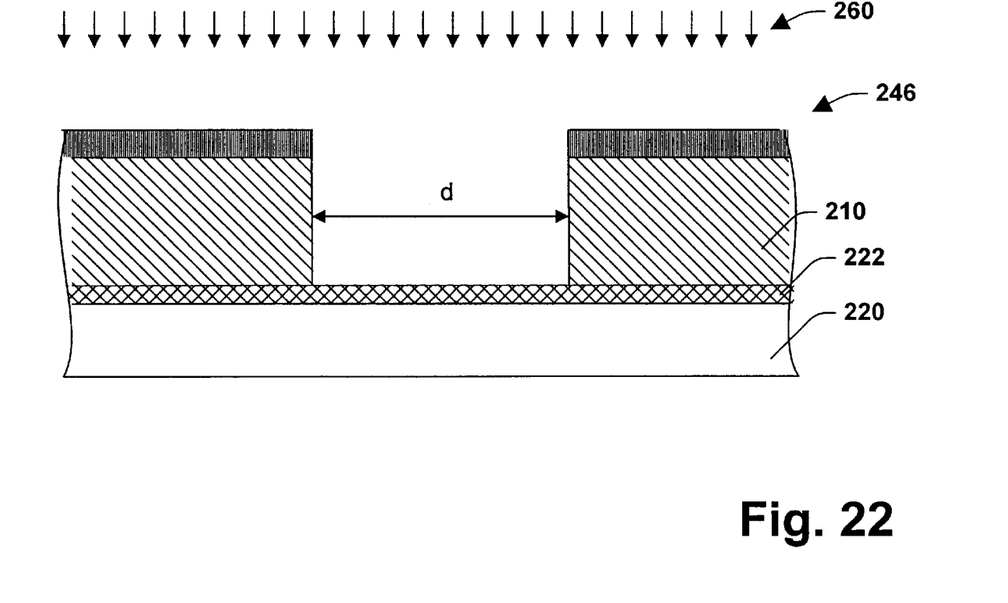
FIG. 22 illustrates the hard mask being removed via a stripping step in accordance with one aspect of the present invention.
Figure 23:
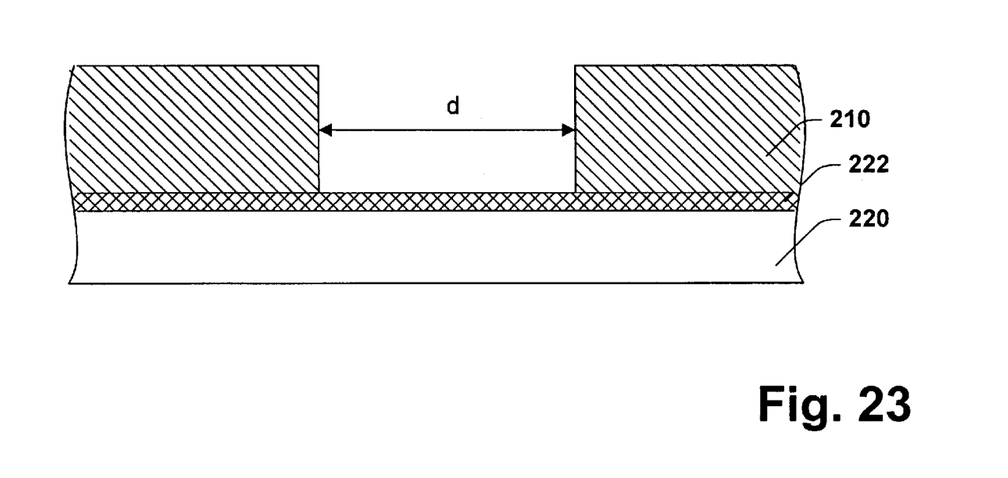
FIG. 23 illustrates the underlayer after the etching step and stripping step are substantially complete in accordance with one aspect of the present invention.

FIG. 22 illustrates the hard mask 246 being removed via a stripping step 260.

FIG. 22 illustrates the underlayer 210 after the etching step 250 and the stripping step 260 are substantially complete.

It is to be appreciated that the underlayer 210 may comprise any material which affords for an etch chemistry which is highly selective to the underlayer material over the silicon dioxide containing hard mask 246. Likewise, any etch chemistry may employed which provides for selectively etching the underlayer 210 material over the hard mask 246.

The present invention provides for achieving critical feature dimensions at about 0.25 µm or less, including about: 0.18 µm or less; about 0.09 µm or less; about 0.075 µm or less; and about 0.05 µm or less, depending on the wavelength of the radiation used.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A lithographic process, comprising the steps of:
   forming an ultra-thin photoresist on an underlayer surface to be etched, the ultra-thin photoresist including silicon;
   patterning the ultra-thin photoresist layer with short wavelength radiation to define a pattern;
   prior to an etch step, oxidizing the ultra-thin photoresist so as to convert the silicon therein to silicon dioxide; and
   using the oxidized ultra-thin photoresist layer as a hard mask during the etch step to transfer the pattern to the underlayer, the etch step including an etch chemistry that is selective to the underlayer over the oxidized ultra-thin photoresist layer.

2. The method of claim 1 further including the step of using at least one of tungsten, copper, aluminum, an aluminum alloy, titanium, titanium nitride, and silicon nitride as the underlayer material.

3. The method of claim 1, further including the step of having the ultra-thin photoresist include at least 5% silicon by weight.

4. The method of claim 1, further including the step of having the ultra-thin photoresist include at least 10% silicon by weight.

5. The method of claim 1, further including the step of having the ultra-thin photoresist include at least 20% silicon by weight.

6. The method of claim 1, further including the step of having the ultra-thin photoresist include at least 30% silicon by weight.

7. The method of claim 1, further including the step of having the ultra-thin photoresist include at least 40% silicon by weight.

8. The method of claim 1, further including the step of forming the ultra-thin photoresist layer to have a thickness within the range of about 500 Å to 5000 Å.

9. The method of claim 1, further including the step of forming the ultra-thin photoresist layer to have a thickness within the range of about 1000 Å to 4000 Å.

10. The method of claim 1, further including the step of forming the ultra-thin photoresist layer to have a thickness within the range of about 500 Å to 2000 Å.

11. The method of claim 1, further including the step of using radiation having a wavelength less than about 200 nm.

12. The method of claim 1, further including the step of using radiation having a wavelength less than about 160 nm.

13. The method of claim 1, further including the step of using radiation having a wavelength less than about 100 nm.

14. The method of claim 1, further including the step of using radiation having a wavelength of about 13 nm.

15. The method of claim 1, further including the step of using radiation having a wavelength of about 11 nm.

16. The method of claim 1, further including the step of using X-rays as the radiation.

17. The method of claim 1, further including the step of using extreme ultra-violet radiation as the short wavelength radiation.

18. The method of claim 1, further including the step of using deep ultra-violet radiation as the short wavelength radiation.

19. The method of claim 1, further including an etch chemistry for the etch step having a selectivity to the underlayer over the oxidized ultra-thin photoresist layer greater than about 40:1.

20. The method of claim 1, further including an etch chemistry for the etch step having a selectivity to the underlayer over the oxidized ultra-thin photoresist layer greater than about 30:1.

21. The method of claim 1, further including an etch chemistry for the etch step having a selectivity to the underlayer over the oxidized ultra-thin photoresist layer greater than about 20:1.

22. The method of claim 1, further including an etch chemistry for the etch step having a selectivity to the underlayer over the oxidized ultra-thin photoresist layer greater than about 10:1.

23. The method of claim 1, further including an etch chemistry for the etch step having a selectivity to the underlayer over the oxidized ultra-thin photoresist layer greater than about 5:1.

24. The method of claim 1, further including the step of using a high density fluorocarbon plasma based chemistry in the etch step.

25. The method of claim 1, further including the step of using a $SF_6$ and $O_2$ based chemistry in the etch step.

26. The method of claim 25, further including the step of using a power level within the range of 200 W to 800 W; pressure within the range of 20 mT to 200 mT; $SF_6$ within the range of 30 sccm to 50 sccm; and $O_2$ within the range of 10 sccm to 40 sccm.

27. A lithographic process, comprising the steps of:
forming an intermediate layer on an underlayer surface;
forming an ultra-thin photoresist on the intermediate layer, the ultra-thin photoresist including silicon;
patterning the ultra-thin photoresist layer with short wavelength radiation to define a pattern;
prior to an etch step, oxidizing the ultra-thin photoresist so as to convert the silicon therein to silicon dioxide; and
using the oxidized ultra-thin photoresist layer as a hard mask during the etch step to transfer the pattern to the intermediate layer and the underlayer, the etch step including an etch chemistry that is selective to the intermediate layer and the underlayer over the oxidized ultra-thin photoresist layer.

28. A lithographic process for fabricating conductive lines, comprising the steps of:
forming a barrier layer over a substrate;
forming a conductive layer over the barrier layer;
forming an intermediate layer over the conductive layer;
forming an ultra-thin photoresist over the intermediate layer, the ultra-thin photoresist including at least 5% silicon, the ultra-thin photoresist layer having a thickness within the range of 50 Å to 2000 Å;
patterning the ultra-thin photoresist layer with short wavelength radiation to define a pattern of conductive lines, the short wavelength radiation having a wavelength within the range of 4 nm to 200 nm;
prior to an etch step, oxidizing the ultra-thin photoresist with an $O_2$ plasma so as to convert the silicon therein to silicon dioxide;
using the oxidized ultra-thin photoresist layer as a hard mask during the etch step to transfer the pattern to the intermediate layer and the conductive layer, the etch step including an etch chemistry that is highly selective to the intermediate layer and the conductive layer over the oxidized ultra-thin photoresist layer; and
removing the oxidized ultra-thin photoresist layer and the intermediate layer.

29. A lithographic process, comprising the steps of:
forming an ultra-thin photoresist on an underlayer surface to be etched, the ultra-thin photoresist including silicon;
patterning the ultra-thin photoresist layer with short wavelength radiation to define a pattern;
prior to an etch step, exposing the ultra-thin photoresist to an oxygen plasma so as to convert the silicon therein to silicon dioxide; and
using the oxidized ultra-thin photoresist layer as a hard mask during the etch step to transfer the pattern to the underlayer, the etch step including an etch chemistry that is selective to the underlayer over the oxidized ultra-thin photoresist layer.

30. A lithographic process, comprising the steps of:
forming an ultra-thin photoresist on an underlayer surface to be etched, the ultra-thin photoresist including silicon;
patterning the ultra-thin photoresist layer with short wavelength radiation to define a pattern;
thermally oxidizing the ultra-thin photoresist so as to convert the silicon therein to silicon dioxide; and
using the oxidized ultra-thin photoresist layer as a hard mask during an etch step to transfer the pattern to the underlayer, the etch step including an etch chemistry that is selective to the underlayer over the oxidized ultra-thin photoresist layer.

* * * * *